(12) United States Patent
Bureau et al.

(10) Patent No.: US 6,492,194 B1
(45) Date of Patent: Dec. 10, 2002

(54) METHOD FOR THE PACKAGING OF ELECTRONIC COMPONENTS

(75) Inventors: Jean-Marc Bureau, Valbonne (FR); Jacques Elziere, Contes (FR); Daniel Le Bail, Tourrettes S/Loup (FR); Christian Lelong, Vallauris (FR); Ngoc-Tuan Nguyen, Mougins (FR)

(73) Assignee: Thomson-CSF, Paris (FR)

( * ) Notice: Subject to any disclaimer, the term of this patent is extended or adjusted under 35 U.S.C. 154(b) by 20 days.

(21) Appl. No.: 09/688,358

(22) Filed: Oct. 12, 2000

(30) Foreign Application Priority Data

Oct. 15, 1999 (FR) .............................. 99 12916

(51) Int. Cl.⁷ .............................................. H01L 21/56
(52) U.S. Cl. ...................................... 438/106; 438/127
(58) Field of Search .................................. 438/106, 127

(56) References Cited

U.S. PATENT DOCUMENTS

| | | |
|---|---|---|
| 4,563,541 A | 1/1986 | Lebailly et al. |
| 4,568,796 A | 2/1986 | Lebailly et al. |
| 4,768,130 A | 8/1988 | Bernard et al. |
| 4,855,022 A | 8/1989 | Poupard et al. |
| 5,235,463 A | 8/1993 | Broussoux et al. |
| 5,262,351 A | 11/1993 | Bureau et al. |
| 5,410,789 A | 5/1995 | Noto et al. |
| 5,418,365 A | 5/1995 | Robin et al. |
| 5,437,195 A | 8/1995 | Bureau et al. |
| 5,618,737 A | 4/1997 | Robin et al. |
| 5,774,960 A | 7/1998 | De Fraguier et al. |
| 5,908,304 A | 6/1999 | Oudart et al. |
| 6,044,533 A | 4/2000 | Bureau et al. |

FOREIGN PATENT DOCUMENTS

| | | |
|---|---|---|
| EP | 0 840 369 A1 | 5/1998 |
| WO | WO 97/45955 | 12/1997 |
| WO | WO 99/43084 | 8/1999 |

*Primary Examiner*—Richard Elms
*Assistant Examiner*—Beth E. Owens
(74) *Attorney, Agent, or Firm*—Oblon, Spivak, McClelland, Maier & Neustadt, P.C.

(57) ABSTRACT

A method for the packaging of electronic components, including the mounting of at least one electronic component on its active face side to a base, the base including electrical contacts on an external face and connection pads on a face opposite the external face, and including a first series of via holes connecting the electrical contacts and the connection pads and a second series of holes for use in aspiration. A deformable film is deposited on the face opposite to the active face of the electronic component or components. The deformable film is aspirated through the second series of holes from the face opposite the external face of the base, so as to sheath the electronic component or components. The method may furthermore include, on top of the deformable film, a mineral deposition to provide for the hermetic sealing of the components and a conductive deposition to provide for the shielding. Such an application may find particular application to surface wave filters.

16 Claims, 4 Drawing Sheets

SECTION AA'

METHOD FOR THE PACKAGING OF ELECTRONIC COMPONENTS

BACKGROUND OF THE INVENTION

1. Field of the Invention

The present invention relates to the packaging of electronic components, especially components whose surface needs to be unoccupied such as surface acoustic wave (SAW) filters, RF components, sensors and, more specifically, the method for making a packaging of this kind.

Surface wave components (SWC) used in electronics, especially as filters in the radiofrequency domains or intermediate frequency domains, in order to select frequency bands in mobile telephony, make use of the principle of the generation and propagation of acoustic waves on the surface of a piezoelectric substrate. This function makes it necessary to prepare a free space on the surface of the component on which the acoustic waves are propagated. Thus, the standard methods for the protection of surface acoustic wave components use hermetically sealed ceramic or metal packs. However, these methods are costly and unproductive, and make it difficult to minituarize the components.

2. Description of the Prior Art

In the field of semiconductor components, assembling technologies known as CSP (for Chip-Size Package or Chip-Scale Package technologies) give a high degree of miniaturization. The technology that is presently most worthwhile in terms of degree of miniaturization and cost is based on a flip-chip mounting technique (known to those skilled in the art) as illustrated in FIG. 1.

More specifically, a semi-conductor component 1 is attached to a base 2 by means of "flip-chip" type contacts 11 and 12. Electrical pads 21 and 22 connect the entire component 1 to external circuits by internal metallizations and via holes through the base. An encapsulation resin (not shown) consolidates the mechanical assembly and protects the component.

However, this method is not directly applicable to surface-wave components: the encapsulation resin fills the interstice between the component and the base. This disturbs the propagation of the surface acoustic waves. Secondly, since the active surface is not passivated, unlike the semiconductor components, the resin by itself is not a sufficient barrier against external attack from agents such as moisture.

In the more particular field of surface acoustic wave filters, the firm Siemens Matsushita Components GmbH has proposed the packaging of components by the fabrication of a sheath forming caps that surround the chips and lie on the substrate in regions between the chips (WO 99/43084). The caps may be obtained from a metal foil fixed to a weldable frame of the base, or a plastic foil bonded to the base between the chips. In the case of a plastic sheet, even if it is metallized, the shielding is neither hermetically sealed nor perfectly shielded.

The present invention proposes to collectively sheath the chips with a deformable plastic film that will adhere to the back and sides of the chips as well as to the substrate. This method has the advantage of boosting the mechanical strength of the chip on the base. It also has the advantage wherein, after a step described here below for the local elimination of the film, it presents a structure on which it is easy to make a continuous mineral deposit that perfectly seals the structure. Finally, if the mineral deposit is chosen to be metallic, a continuous electromagnetic shielding is made, and this shielding could be in direct contact with the electrical ground on the substrate.

The deformable film, adgering to the rear face and the side faces of the chips as well as to the base between teh chips, forms a monolithic unit with high mechanical strength.

SUMMARY OF THE INVENTION

More specifically, an object of the invention is a method for the packaging of electronic components, comprising the following steps:

The mounting of at least one electronic component on its active face side to a base, said base comprising electrical contacts on a first face and connection pads on a second face, and comprising a series of via holes connecting the electrical contacts and the connection pads and a series of holes.

The deposition of a deformable film on the face opposite to the active face of the electronic component or components.

The aspiration of the deformable film through the series of holes from the second face of the base, so as to sheath said electronic component or components and place these components in contact with the deformable film so as to form a solid assembly.

According to one variant of the invention, the method of the invention may furthermore include a step for the total elimination of the film on the base in the zone between the chips enabling the mineral deposit to totally sheath the component and thus provide perfect hermetic sealing quality. In the case of a metal deposit, this step also provides for the resumption of an electrical ground contact on the substrate and thus provides for efficient electromagnetic shielding.

An object of the invention is also a method for the batch manufacture of packaged electronic components comprising the following steps:

The batch mounting of electronic components on the active face side to a base, said base comprising electrical contacts on a first face and connection pads on a second face, and comprising a series of via holes connecting the electrical contacts and the connection pads and a series of holes.

The deposition of a deformable film on all the faces opposite the active faces of the electronic components.

The aspiration of the deformable film through the series of holes from the second face of the base, so as to sheath said electronic components The deposition of an encapsulating resin on the deformable film so as to provide hermetically sealed protection for the electronic components.

The cutting out of the unit formed by the resin/deformable film/base so as to individualize the packaged electronic components.

According to one variant of the invention, the component or components are surface acoustic wave devices.

Advantageously, the aspiration of the deformable film is coupled with a heating step and/or a step for the application of a pressure to the surface of the deformable film.

According to one variant of the invention, the packaging method furthermore comprises a deposition of a mineral layer to provide hermetic sealing on top of the deformable film.

Advantageously, the packaging method may also include a conductive deposition on top of the deformable film in order to provide for the shielding of the components.

The packaging method may also include the depositing of a second deformable film (that may be identical to the first deformable film) on top of the conductive deposit. It may advantageously be a polymer film charged with conductive mineral particles. This second film may thus replace the standard packaging resin in contact with the exterior.

BRIEF DESCRIPTION OF THE DRAWINGS

The invention will be understood more clearly and other advantages will appear from the following description, given on a non-restrictive basis and with reference to the appended drawings, of which.

MORE DETAILED DESCRIPTION

We shall describe a method for the batch manufacture of packaged electronic components especially suited to the case of surface acoustic wave components for which it is imperative to preserve a free space for the propagation of the acoustic waves.

Figure 1:
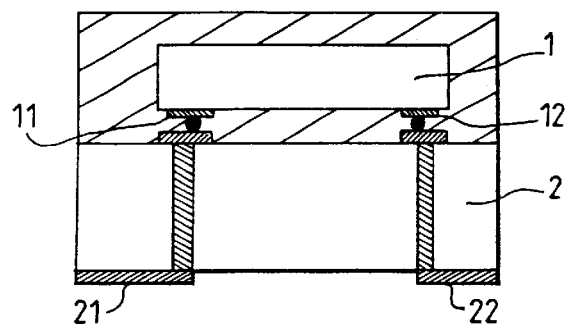
FIG. 1 exemplifies a packaged component according to the prior art.
Figure 2A:
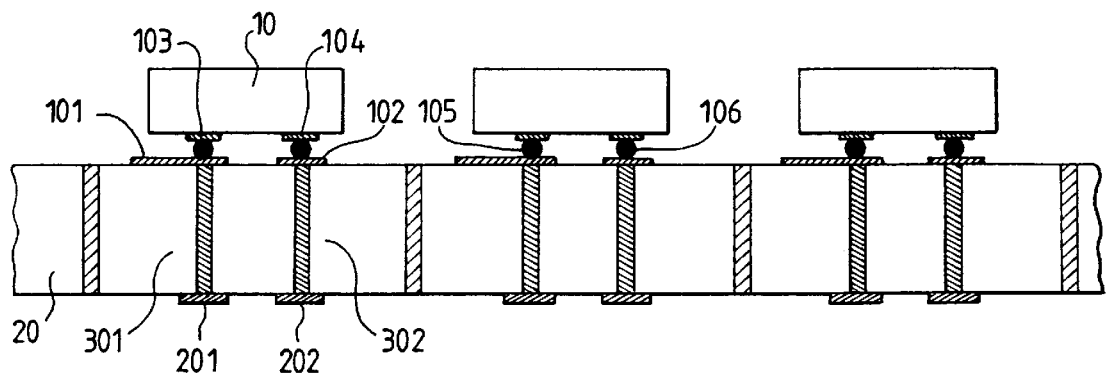
FIGS. 2a to 2b illustrate the steps of a method of packaging according to the invention.

The method of manufacture comprises a first step illustrated in FIG. 2a in which the components 10 are mounted, in a batch, on a board 20. This board has the connection pads 201 and 202 on one of its faces called an external face and connection pads 101 and 102 on the face opposite the external face. The latter pads 101 and 102 are used to connect the exterior of the electrical contacts 103 and 104 of the components 10 by "flip-chip" type mounting by means of first conductive via holes 301, 302 and intermediate conductive elements 105, 106. These intermediate conductive elements may be metal balls made of gold or they may be solder balls. The electrical contact operation may be done by thermocompression, bonding or ultrasonic soldering.

Figure 2B:
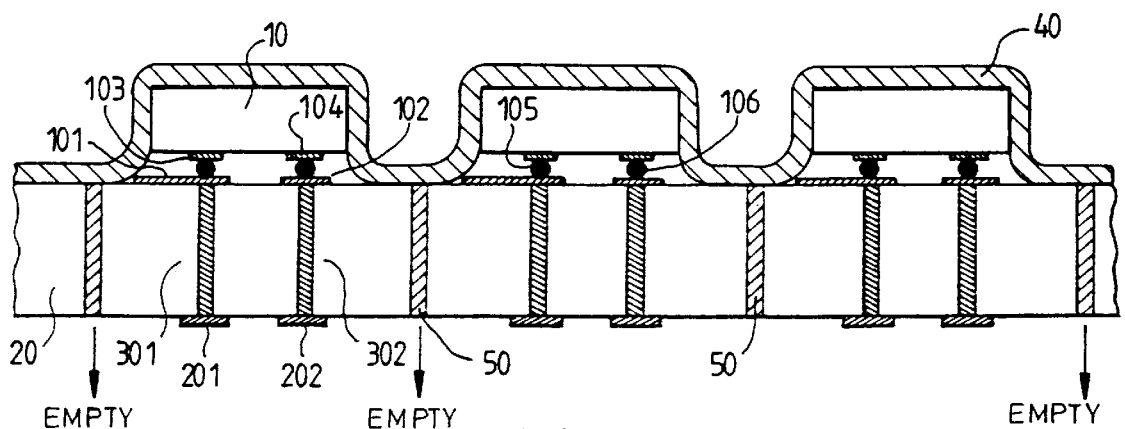

In a second step, a deformable film 40 is deposited on all the components as shown in FIG. 2b. By aspiration through a series of holes 50 made in the board 20, this film gets conformated and sheathes the components. It may be, for example, a deformable plastic film. The operation of aspiration may advantageously be combined with a heating operation and/or an operation for applying pressure to the surface of the film to improve its deformation. Typically, the operation of aspiration may be done in an autoclave under vacuum. The deformable film is preferably a very thin film that can have a thickness of about a hundred microns. To achieve this, it is possible advantageously to use an adhesive deposited beforehand on the entire face of the film pointed towards the components, or on all or part of the board. It is also possible to use a film having thermo-adhesive properties (such as thermoplastic film) that can be implemented by effect of the temperature and pressure. The film, in particular, may be Pyralux by Du Pont, Ablefilm by Ablestik or Staystick by Apha Metals. Optionally, this film may be conductive. In particular, it may be a polymer charged with conductive particles or a film metallized on one of its faces. It may furthermore consist of several layers so as to combine the properties of each of them. For example, it is possible to use a conductive layer or a mineral layer with moisture barrier properties, each of the layers having very small thicknesses ranging from some tenths of microns to some microns.

The mineral layer may be of the $SiO_2$, SiN type, deposited by vacuum spray deposition or vacuum plasma deposition. It is also possible to deposit a parylene type organic layer to obtain protection against moisture.

Figure 3A:
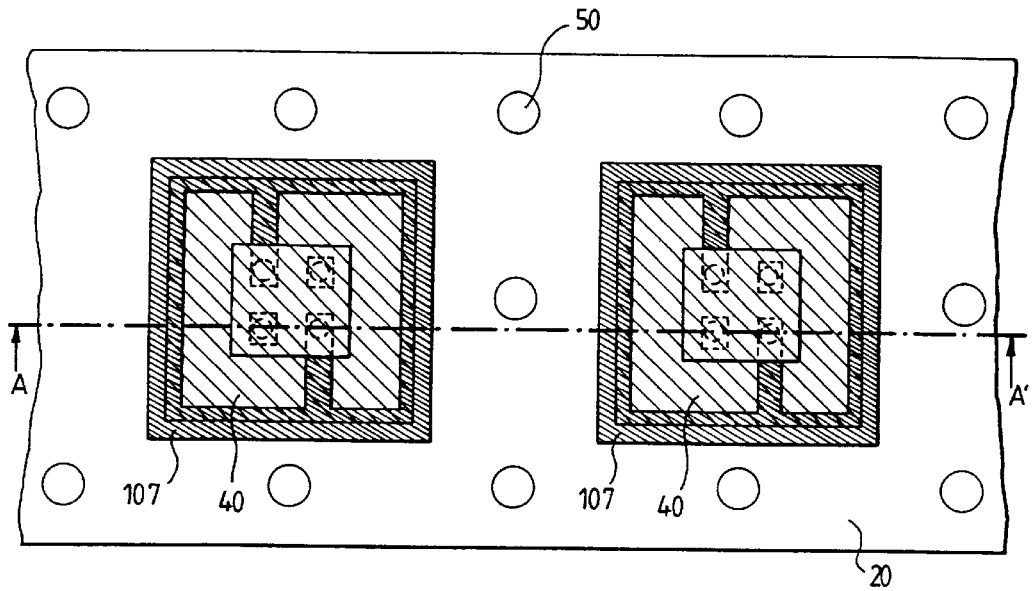
FIGS. 3a and 3b illustrate a step of a packaging method according to the invention comprising the remaking of the electrical contact by etching of the deformable film.
Figure 3B:
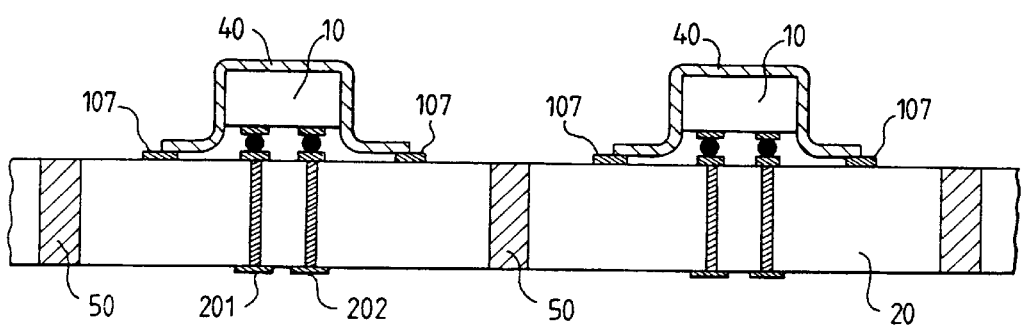

The value of using especially a conductive layer is that it provides electromagnetic shielding to the component. If this layer has to be connected to the ground, it is advantageously possible to do an etching in the deformable film 40 in order to free a conductive zone corresponding to a ground pad of the base. This aperture can be made for example by laser or mechanical drilling (partial sawing out). More specifically, FIG. 3a illustrates a top view of the base comprising the holes 50, through which the aspiration places the deformable film flat against the socket. Ground rings 107 correspond to the ground pads illustrated in the sectional view along the axis AA' of FIG. 3b. The deformable film 40 is etched on a part of the socket as is clearly shown in FIG. 3a and especially on a part of the ground rings 107. Thus, during a subsequent conductive deposition, it will be possible to redo the electrical contact at the ground pads 107.

Figure 5:
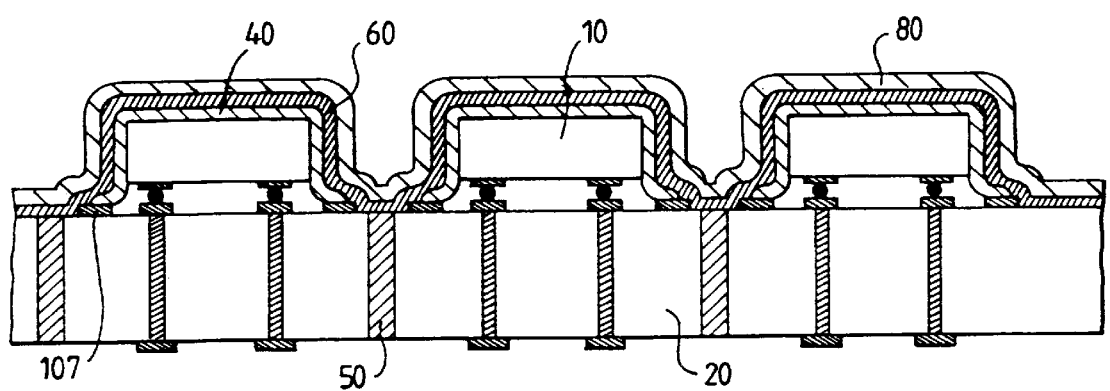
FIG. 5 illustrates a step of final protection by means of a second deformable film.

According to another variant of the invention, the deposition of a second deformable film can be used, as a replacement for a thick resin, to obtain the function of hermetically sealed protection of the component or components. FIG 5, for this purpose, illustrates a configuration in which a second deformable film 80 is deposited on top of the conductive layer 60, which is itself deposited on the surface of the first deformable film 40.

Figure 4A:
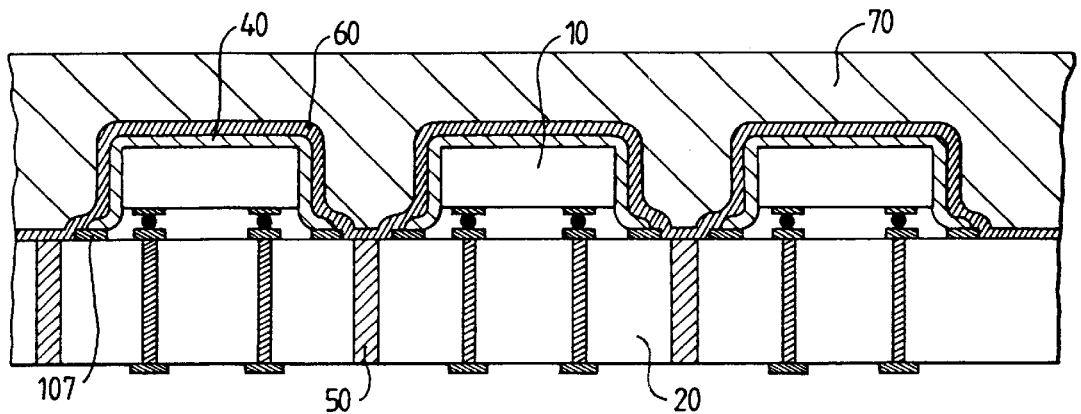
FIGS. 4a and 4b illustrate a step for the final protection, with a thick resin, of the components coated beforehand with the deformable film and for the cutting out of the components in order to individualize them.

The method according to the invention furthermore comprises a final protection step obtained by the casting, on the entire plate, of an encapsulation resin 70 which may be of an epoxy resin type charged with mineral particles on top of the conductive deposit 60 and the deformable film 40. The deformable film deposited beforehand is then a barrier that prevents said encapsulation resin from penetrating between the base arid the components, as shown in FIG. 4a.

Figure 4B:
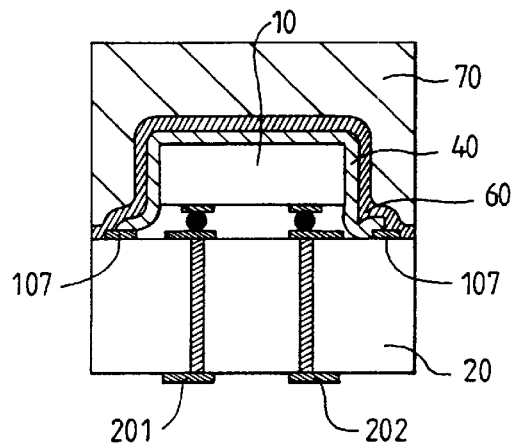

In a standard way, the components may then be tested electrically on the board, individually marked and then separated by mechanical sawing as illustrated in FIG. 4b.

The batch packaging method according to the invention thus provides a high degree of integration because of the thinness of the deformable film. Furthermore, the film and the coating resin boost the mechanical strength of the assembly, making this method perfectly compatible with large-sized surfaced acoustic wave components (which is not the case with packaging in standard hermetically sealed packs with flip-chip type assembly).

What is claimed is:

1. A method for packaging of electronic components, comprising:
    mounting of at least one electronic component to a board such that an active face of the electronic component contacts the board, said board comprising connection pads on an external face and electrical contacts on a face opposite the external face, a first series of via holes connecting the electrical contacts and the connection pads, and a second series of holes for use in aspiration;
    depositing a deformable film on a face for use in aspiration opposite to the active face of the at least one electronic component; and aspirating the deformable film through the second series of holes from the second face of the board, so as to sheath said at least one electronic component and place the at least one electric component in contact with the deformable film to form a solid assembly.

2. The packaging method according to claim 1, wherein the electric component or components are surface acoustic wave devices.

3. The packaging method according to claim 2, wherein the mounting is done by means of soldered metal beads.

4. The packaging method according to claim 3, comprising a heating step combined with the aspiration step.

5. The packaging method according to claim 4, wherein the aspiration step is done with application of pressure to a surface of said film.

6. The packaging method according to claim 5, wherein the deformable film has an adhesive on its face in contact with the face opposite the active face of the electronic component or components.

7. The packaging method according to claim 5, wherein the deformable film is a thermoplastic film.

8. The packaging method according to claim 7, wherein the deformable film is a conductive film.

9. The packaging method according to claim 8, wherein the deformable film has a thickness of the order of several tens of microns.

10. The packaging method according to claim 9, further comprising a mineral deposition on the deformable film.

11. The packaging method according to claim 10, comprising a conductive deposit to shield the electric component or components.

12. The packaging method according to claim 11, comprising a step for a local cutting out of the deformable film at least at certain connection pads so as to provide for a remaking of the electrical contacts.

13. The packaging method according to claim 11, comprising the deposition of a thick encapsulation resin on the deformable film in order to provide for hermetically sealed protection of the electronic component or components.

14. The packaging method according to claim 12, comprising the deposition of a second deformable film on the deformable film so as to provide hermetically sealed protection for the electronic component or components.

15. The packaging method according to claim 14, wherein the second deformable film is a polymer charged with conductive mineral particles.

16. A method for batch manufacture of packaged electronic components comprising:

batch mounting electronic components to a board such that active faces of the electrianic components contact the board, said board comprising connection pads on an external face and electrical contacts on a face opposite the external face, a first series of via holes connecting the electrical contacts and the connection pads, and a second series of holes for use in aspiration;

depositing a deformable film on all faces of the electrical components opposite the active faces of the electronic components;

aspirating the deformable film through the second series of holes from the second face of the board, so as to sheath said electronic components;

depositing an encapsulating resin on the deformable film so as to provide hermetically sealed protection for the electronic components; and cutting out of a unit formed by the resin/deformable film/base so as to individualize the packaged electronic components.

* * * * *